(12) United States Patent
Loiko et al.

(10) Patent No.: US 9,202,930 B2
(45) Date of Patent: Dec. 1, 2015

(54) MEMORY WITH DISCRETE STORAGE ELEMENTS

(75) Inventors: Konstantin V. Loiko, Austin, TX (US); Brian A. Winstead, Austin, TX (US); Mehul D. Shroff, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 373 days.

(21) Appl. No.: 13/111,580

(22) Filed: May 19, 2011

(65) Prior Publication Data
US 2012/0292683 A1 Nov. 22, 2012

(51) Int. Cl.
*H01L 29/788* (2006.01)
*H01L 29/423* (2006.01)
*H01L 29/66* (2006.01)
*B82Y 10/00* (2011.01)
*G11C 16/04* (2006.01)

(52) U.S. Cl.
CPC ............ *H01L 29/7881* (2013.01); *B82Y 10/00* (2013.01); *H01L 29/42332* (2013.01); *H01L 29/66825* (2013.01); *G11C 16/0425* (2013.01)

(58) Field of Classification Search
USPC ................................................ 257/314–320
See application file for complete search history.

(56) References Cited

U.S. PATENT DOCUMENTS

| | | | |
|---|---|---|---|
| 6,927,435 B2 * | 8/2005 | Moriya et al. | 257/295 |
| 7,821,055 B2 | 10/2010 | Loiko et al. | |
| 8,367,492 B2 * | 2/2013 | Chidambarrao et al. | 438/198 |
| 8,502,299 B2 * | 8/2013 | Yan et al. | 257/316 |
| 2005/0199945 A1 * | 9/2005 | Kodama et al. | 257/324 |
| 2007/0132054 A1 | 6/2007 | Arghavani et al. | |
| 2008/0121966 A1 * | 5/2008 | Muralidhar et al. | 257/315 |

OTHER PUBLICATIONS

Arghavani et al.; "Stress Management in Sub-90-nm Transistor Architecture"; IEEE Transactions on Electron Devices; Oct. 2004; pp. 1740-1743; vol. 51, No. 10; IEEE.

Ching et al.; "Improved Electrical Performance for 65nm Node and Beyond Through the Integration of HARP 03/TEOS Oxide Films for STI, PMD, and Thin Film Applications"; ISSM Paper PE-P-224; 2007; 4 pgs.; IEEE.

Tilke et al.; "Shallow Trench Isolation for the 45-nm CMOS Node and Geometry Dependence of STI Stress on CMOS Device Performance"; IEEE Transactions on Semconductor Manufacturing; May 2007; pp. 59-67; vol. 20, No. 2; IEEE.

Tilke et al.; "STI Gap-Fill Technology with High Aspect Ratio Process for 45nm Cmos and beyond"; IEEE/SEMI Advanced Semiconductor Manufacturing Conference; 2006; pp. 71-76; IEEE.

"Advanced STI and PMD Gap Fill for less than 65nm Technology Nodes"; Applied Materials; Santa Clara, CA., 2007.

Arghavani, R. et al., "Strain Engineering to Improve Data Retention Time in Nonvolatile Memory", IEEE Transactions on Electron Devices, vol. 54, Issue 2, Feb. 2007, pp. 362-365.

* cited by examiner

Primary Examiner — Ori Nadav
(74) Attorney, Agent, or Firm — David G. Dolezal

(57) ABSTRACT

A method of making a non-volatile memory cell includes forming a plurality of discrete storage elements. A tensile dielectric layer is formed among the discrete storage elements and provides lateral tensile stress to the discrete storage elements. A gate is formed over the discrete storage elements.

10 Claims, 3 Drawing Sheets

US 9,202,930 B2

MEMORY WITH DISCRETE STORAGE ELEMENTS

BACKGROUND OF THE INVENTION

1. Field of the Invention

This invention relates to memory devices and more specifically to memory devices with discrete storage elements.

2. Description of the Related Art

Memories are used to store data. In some types of non volatile memory, charge is selectively stored in a charge storage structure of a memory cell to selectively store one value (e.g. a "1" or a "0") in the cell, where a lack of charge is indicative of the opposite value being stored. In one example, a charge storage structure of a memory device can be implemented with a layer of discrete storage elements such as silicon nanocrystals.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

It has been discovered that providing a layer of discrete storage elements with portions of a tensile dielectric layer located laterally between the discrete storage elements of the layer may provide for a reduction in charge leakage from the discrete storage elements. Accordingly, a memory cell implementing such a layer may be able to retain stored charge in the discrete storage elements for a longer period of time.

FIGS. 1-4 set forth various manufacturing stages of a wafer that includes a memory cell that implements a charge storage structure utilizing a layer of discrete storage elements with portions of a tensile dielectric layer located laterally between the discrete storage elements. In the embodiments shown, the memory cell formed is a split gate memory cell with a control gate and a select gate. However, such a layer of discrete storage elements and tensile dielectric material may be implemented in other types of memory cells. See for example FIG. 6.

Figure 1:
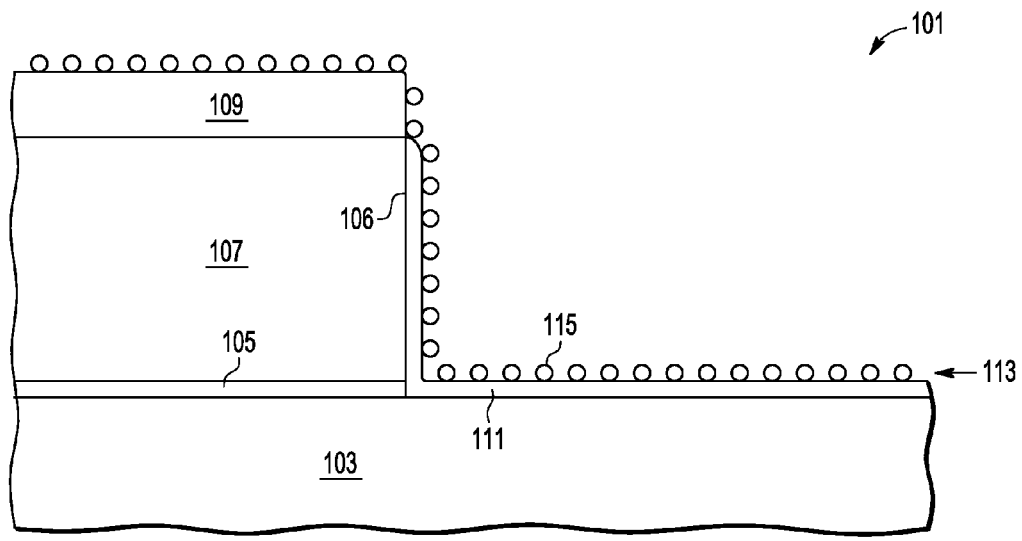
FIGS. 1-4 set forth partial cut away side views of a wafer in various stages of its manufacture according to one embodiment of the present invention.

FIG. 1 shows a partial cutaway side view of wafer 101. Wafer 101 includes a substrate 103 of semiconductor material (e.g. monocrystal silicon, silicon germanium). In one embodiment, substrate 103 has a bulk substrate configuration, but may have other configurations such as a semiconductor on insulator (SOI) configuration in other embodiments.

A layer 105 of select gate dielectric material, a layer 107 of select gate material, and nitride material layer 109 is formed over wafer 101 and patterned (e.g. using a photolithographic process) to form a side wall 106. In one embodiment, layer 105 is made of silicon dioxide or a high K dielectric (e.g. hafnium oxide) and has a thickness in the range of 20-50 Angstroms (A), but may have other thicknesses in other embodiments. Layer 107 is made of a select gate material such as doped polysilicon and has a thickness in the range of 500-1500 A, but may have other thicknesses and/or be made of other gate materials in other embodiments. Layer 109 is used to provide separation between layer 107 and subsequent layers. In one embodiment, it has a thickness in the range of 200-400 A, but may have other thicknesses in other embodiments and/or be made of other materials in other embodiments.

After patterning, a tunnel dielectric layer 111 is formed on sidewall 106 and on exposed portions of substrate 103 by an oxidation process. In one embodiment, layer 111 has a thickness in the range of 50-70 A, but may be formed of other materials, formed by other processes, and/or have other thicknesses in other embodiments.

A layer 113 of discrete storage elements is formed over wafer 101 on layer 111 and layer 109 including along layer sidewall 106. In one embodiment, the discrete storage elements are silicon nanocrystals. In other embodiments, the discrete storage elements may be made of other types of material such as e.g. silicon germanium nanocrystals, nanoclusters of a metal (e.g. gold, ruthenium, nickel, cobalt, tungsten), or nanoclusters of a silicide (e.g. cobalt silicide, nickel silicide). The discrete storage elements are utilized to selectively store charge introduced during a programming operation to selectively adjust a voltage threshold of a transistor depending upon whether a "1" or "0" value is to be stored in the memory cell. In one embodiment, the discrete storage elements have a diameter in the range of 50-200 Angstroms. However, the elements may be of other diameters in other embodiments In one embodiment where the discrete storage elements are silicon nanocrystals, the nanocrystals may be formed by depositing a thin layer of silicon over wafer 101 and annealing the wafer, where the silicon coalesces into the discrete nanocrystals. Multiple silicon layers may be applied and annealed to increase the height of the nanocrystals. However, discrete storage elements may be formed by other methods in other embodiments.

Figure 2:
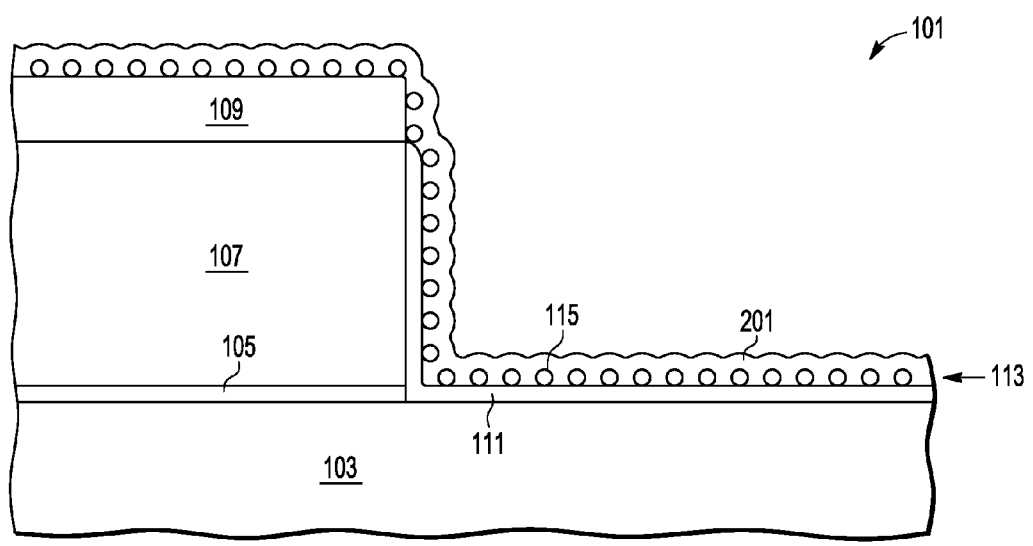

In some embodiments, a nitrogen anneal may be performed on the discrete storage elements to form a thin nitride layer (e.g. 5 A) on the elements after the stage shown in FIG. 2 (although this layer of nitride is not shown in the Figures).

FIG. 2 shows wafer 101 after the formation of a tensile dielectric layer 201 over wafer 101. Portions of layer 201 are formed laterally between the discrete storage elements of layer 113. A tensile layer is a layer that when deposited as a film on a flat wafer acts to bend the wafer to have a concave shape with respect to the side of the wafer that the film is deposited. In contrast, a compressive layer is a layer that when deposited on a flat wafer acts to bend the wafer to have a convex shape with respect to the side of the wafer that the film is deposited. The degree of tensile stress can be quantified in Pascals of a positive number and the degree of compressive stress can be quantified in Pascals (Pa) of a negative number.

In one embodiment, layer 201 has a thickness that is comparable to the height of a discrete storage element (e.g. 115). For example, in some embodiments, the thickness of layer 201 is at least 80% of the average height of the discrete storage elements. In some embodiments, providing a memory cell with the tensile dielectric layer having a thickness of at least 80% of the average height of the discrete storage elements may ensure that an adequate amount of the tensile dielectric layer is located between the discrete storage elements of a layer. In one embodiment, layer 201 has a thickness in the range of 50-200 A, but maybe of other thicknesses in other embodiments. In other embodiments, the thickness of the dielectric layer 201 may be of a different percentage of the average height of the discrete storage elements. In one embodiment, layer 201 is made of an oxide material.

In one embodiment, layer 201 is formed by a high aspect ratio process (HARP) by APPLIED MATERIALS of Santa Clara Calif. In one embodiment, the HARP process is an ozone/tetraethoxylonesilane (TEOS) based sub-atmospheric chemical vapor deposition fill process. In one embodiment, the HARP process provides for a greater than 10:1 aspect ratio gap-fill capability without voids or seams. In some embodiments, as deposited, the film is nearly 200 MPa tensile. In one embodiment, the deposition temperature is at 540 Celsius (C). However, in other embodiments, layer 201 may be formed by other processes and/or have other tensile strengths. In one embodiment, tensile layer 201 may be formed of multiple layers of different materials.

Figure 3:
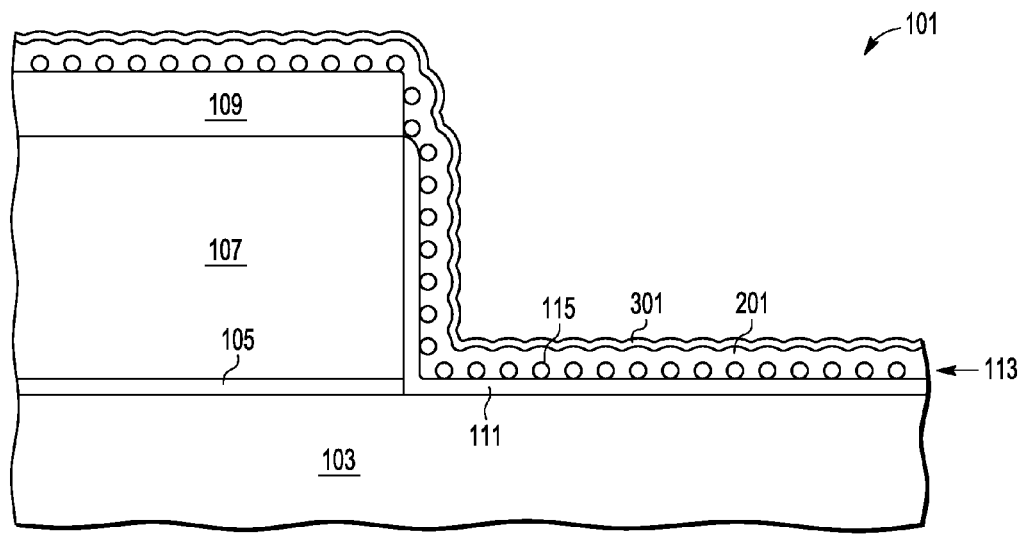

FIG. 3 shows wafer 101 after the formation of a compressive dielectric layer 301. A compressive dielectric layer is a dielectric layer under compressive stress. In one embodiment, layer 301 is formed of a high temperature oxide process. The process is a rapid thermal chemical vapor deposition having a deposition temperature of 750 C, a pressure in the range of 50-200 Torr, a $SiH_4$ flow rate in the range of 2-20 sccm, and a $N_2O$ flow rate of 3000 sccm. Layer 301 may be formed by other processes in other embodiments. In one embodiment, layer 301 has a thickness in the range of 20-90 A, but may have other thicknesses in other embodiments. In one embodiment, layer 301 is about 25% as thick as layer 201. In one embodiment, layer 301 makes up the difference between the thickness of layer 201 and a total desired thickness of layers 201 and 301.

In one embodiment, layer 201 is under a tensile stress of approximately 200 MPa and layer 301 is under a compressive stress of approximately −300 MPa. However, layers 201 may be under a different tensile stress and layer 301 may be under a different compressive stress in other embodiments. Also in other embodiments, layer 301 may be in a relaxed state. In some embodiments, layer 201 may be under a tensile stress in the range of 100 to 500 MPa and layer 301 may be under a compressive stress in the range of −100 to −500 MPa. However, layers 201 and 203 may be under different tensile and compressive stresses, respectively, in other embodiments.

Figure 4:
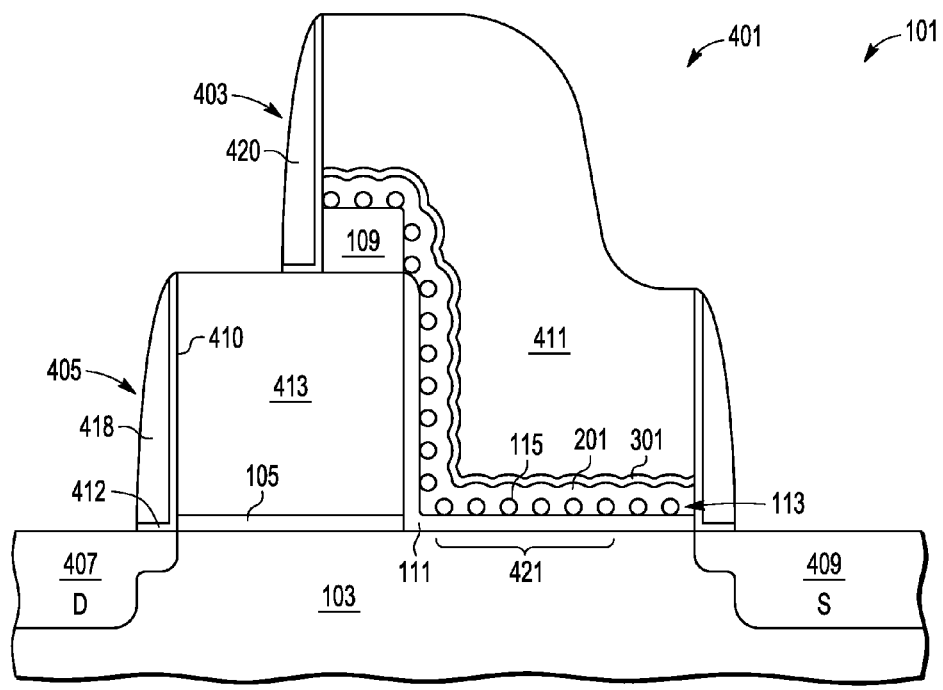

FIG. 4 shows a side view of wafer 101 after a control gate 411, drain region 407, and source region 409 are formed on wafer 101 to form memory cell 401. A layer of control gate material is formed over wafer 101. Afterwards, the layer of control gate material, layer 301, layer 201, layer 113, layer 109, and layer 111 are patterned to form control gate 411 and the structures of those layers shown in FIG. 4. Afterwards, layer 107 is patterned to define the left sidewall 410 to form select gate structure 413. Spacers 403 and 405 are formed by depositing an oxide liner 412 over wafer 101 followed by a layer of nitride. The nitride layer is anisotropically etched to form spacer structures 418 and 420. The exposed portion of the oxide liner 412 is then wet etched. In some embodiments, the left sidewall 410 is formed when the right sidewall 106 is formed.

Conductivity dopants are implanted into source region 409 and drain region 407. In some embodiments, source region 409 and drain region 407 may include lightly doped extensions regions formed by ion implantation before the formation of spacers 405 and 403, wherein a heavier ion doping concentration is made following formation of the spacers.

After the stage shown in FIG. 4, portions of control gate 411, select gate 413, source region 409, and drain region 407 are silicided. Contacts embedded in dielectric layers after formed in electrical contact with the silicided regions. The contacts are electrically coupled to electrical interconnects embedded in interlayer dielectric material formed over wafer 101 for interconnecting the memory cells to other circuitry (e.g. word lines, bit lines) located on wafer 101. Electrical contract structures (e.g. pads) are formed over the wafer. Afterwards, wafer 101 is singulated into multiple die, each with multiple cells similar to cell 401 formed in a memory array. Each integrated circuit may include other circuitry (e.g. processors, RAM, peripherals) in addition to the memory circuitry. However, other integrated circuits may have other configurations, circuitry, and/or other structures in other embodiments.

In the embodiment of FIG. 4, the discrete storage elements (115) located in area 421 are the elements that when charge is stored, primarily affect the voltage threshold of the transistor of memory cell 401. When charged is stored in the elements of area 421, the transistor of cell 401 has one voltage threshold, when charge is not stored in the elements of area 421, the cell has a different voltage threshold. During a read operation, the value being stored is read by applying a voltage to control gate 411 that is between the two threshold voltages.

In one embodiment, charge is stored in elements of area 421 by applying programming voltages to select gate 413, control gate 411, drain region 407, and source region 409 during a write operation to the cell. In one embodiment, the source-drain current of a write operation is made sufficiently high to cause high energy electrons to pass through dielectric layer 111 to the discrete storage elements (e.g. 115). One example of a write operation is a hot electron injection process, although other write operations may be used to store charge in other embodiments. Charge may be removed from the charge storage elements by providing erase voltages to gate 413, gate 411, drain region 407, and source region 409 during an erase operation to the cell.

Figure 5:
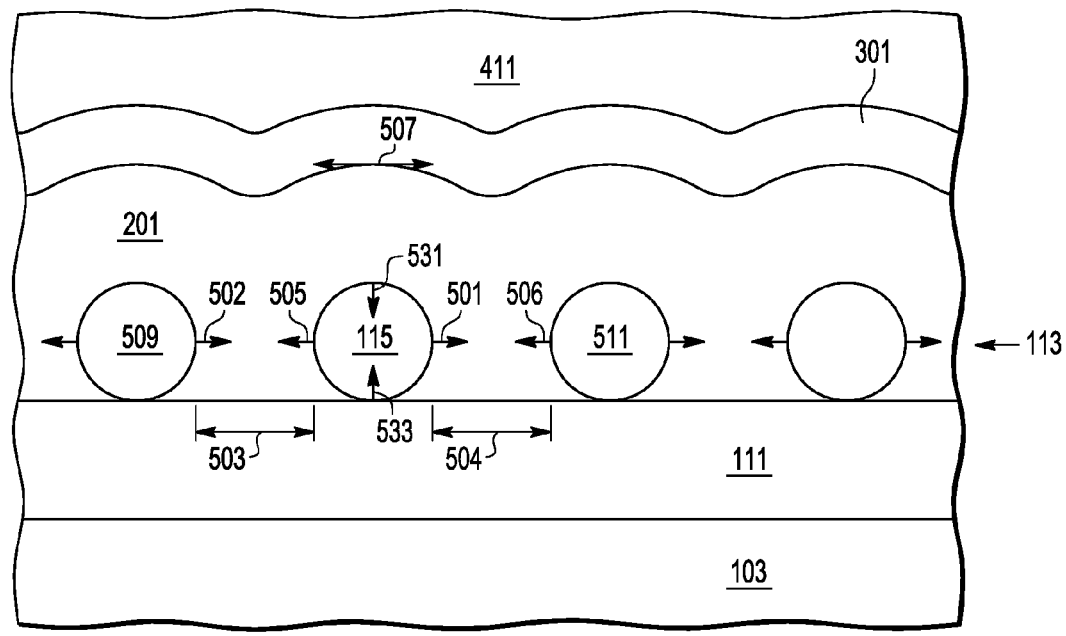
FIG. 5 is a more detailed cutaway side view of a stage of the wafer of the embodiment of FIGS. 1-4.

FIG. 5 is a more detailed view of some of the discrete storage elements 509, 115, and 511 shown in FIG. 4. As shown in FIG. 5, portions of layer 201 are located laterally between the elements of layer 113. For example, layer 201 has material located between elements 509 and 115 in area 503 and has material located between elements 115 and 511 in area 504. Because layer 201 is a tensile layer, those portions of layer 201 between the elements act to provide a tensile stress on the elements 509, 115, 511 in the lateral direction as shown by arrows 502, 505, 501, and 506. These lateral tensile stresses on the elements act to elongate the lattices of those elements in a lateral direction (see arrows 502, 505, 501, and 506). In some embodiments, the lateral tensile stresses on the elements increase the conduction barrier height of the element material with respect to the surrounding dielectric material and to increase the effective mass of the material of the elements. In some embodiments, both of these reduce charge leakage of the elements, thereby allowing the elements to retain charge for a longer period of time. Thus, a memory incorporating cells similar to cell 401 may be able to non-volatility retain data for a longer period of time.

It is believed that in some embodiments, that if the thickness of layer 201 is much greater than the average height of the elements, then the portion of layer 201 located over the elements would reduce the lateral tensile stress on the elements (115). Accordingly, in some embodiments, it may be desirable that the thickness of layer 201 is not greater than 1.25 times the average height of the elements. However, the ratio of the thickness of layer 201 to average height of the elements may be of other ratios in other embodiments. In other embodiments, the thickness of layer 201 may be greater than 1.25 times the average height of discrete storage elements (e.g. 115).

Furthermore, making layer 201 tensile may provide in some embodiments for a relatively greater compressive vertical stress on the elements. The compressive vertical stress on element 115 is shown by arrows 531 and 533. This vertical compressive stress on the elements acts to shorten the lattices of those elements in a vertical direction. The vertical compressive stress on the elements is also believed to increase the conduction barrier height of the element material with respect to the surrounding dielectric material and to increase the effective mass of the material of the elements. Both of these are believed to reduce charge leakage of the elements, thereby allowing the elements to retain charge for a longer period of time.

Providing a second layer 301 that is either compressive or stress neutral allows for a reduction in the thickness of the tensile layer 201. Thus, where the total thickness of the layers 201 and 301 is required to be of a certain value, utilizing layer 301 may allow for an optimization of the thickness of layer 201 with respect to average discrete storage element height for charge retention.

Furthermore, in some embodiments, it is believed that making layer 301 compressive may act to provide for a relatively greater vertical compressive stress on the elements (see arrow 531). This greater vertical compressive stress may act to improve overall charge retention of a memory cell.

As disclosed herein, the term "lateral" with respect to a layer is a direction that is parallel with the layer. The term "vertical" with respect to a layer is a direction that is perpendicular to the layer. For example in FIG. 5, arrow 531 is in a vertical direction with respect to layer 201 and arrow 505 is in a lateral direction with respect to layer 201. In some embodiments, layer 201 would be formed on a vertical side wall wherein a "lateral" direction for that portion of a layer on a side wall would be up and down with respect to the view of FIGS. 1-4.

Figure 6:
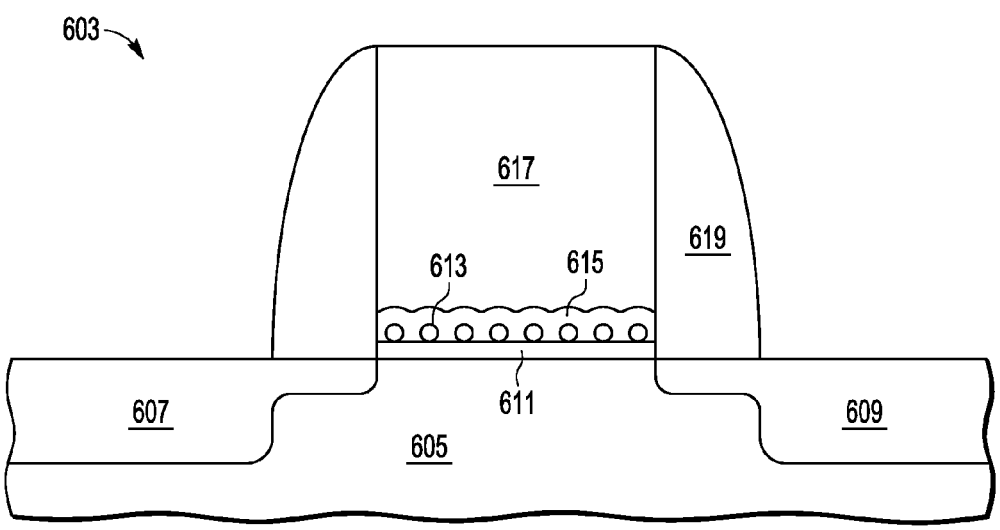
FIG. 6 is a cutaway side view of a wafer at a stage in its manufacture according to another embodiment of the present invention.

FIG. 6 is a partial side cutaway view of a memory cell 603 according to another embodiment of the present invention. Memory cell 603 may be characterized as a one transistor memory cell. Cell 603 includes a control gate 617 located over a substrate 605. Located in substrate 605 are source region 607 and drain region 609. A sidewall spacer 619 surrounds gate 617. Cell 603 includes discrete storage elements 613 for selectively storing charge to store a value. Elements 613 are located on tunnel dielectric 611. As with memory cell 603, layer 615 is a tensile layer that acts to provide a lateral tensile stress and a vertical compressive stress on the elements 613 of cell 603. Note that in the embodiment of FIG. 6, a compressive dielectric layer is not located between gate 617 and layer 615, although such a layer may be included in other embodiments.

A memory cell with discrete storage elements in a tensile dielectric layer may be implemented in other configurations in other embodiments.

In one embodiment, a method of making a non-volatile memory cell comprises forming a plurality of discrete storage elements and forming a tensile dielectric layer among the plurality of discrete storage elements. The tensile dielectric layer is located around each of the plurality of discrete storage elements individually. The method includes forming a gate after the forming the tensile dielectric layer.

In another embodiment, a non-volatile memory cell comprises a plurality of discrete storage elements and a tensile dielectric layer. The tensile dielectric layer is located around each of the plurality of discrete storage elements individually. The non-volatile memory cell comprises a gate in proximity to the tensile dielectric layer.

In another embodiment, a method of making a non-volatile memory comprises forming a first dielectric layer, forming a plurality of discrete storage elements over the first dielectric layer, and forming a tensile dielectric layer over the plurality of discrete storage elements. Each of the plurality of discrete storage elements is individually surrounded by the tensile dielectric layer. The method comprises forming a gate over the tensile dielectric layer.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A non-volatile memory cell, comprising:
 a plurality of discrete storage elements;
 a tensile dielectric layer, the tensile dielectric layer located around each of the plurality of discrete storage elements individually such that portions of the tensile dielectric layer are located laterally between the discrete storage elements of the plurality of discrete storage elements; and
 a gate in proximity to the tensile dielectric layer;
 a compressive dielectric layer on the tensile dielectric layer.

2. The non-volatile memory cell of claim 1, wherein the gate is a control gate.

3. The non-volatile memory cell of claim 1, wherein the tensile dielectric layer has thickness not greater than 125 percent of an average height of the plurality of discrete storage elements.

4. The non-volatile memory cell of claim 1, wherein the plurality of discrete storage elements comprise polysilicon nanocrystals.

5. The non-volatile memory cell of claim 1, wherein the tensile dielectric layer is characterized as being at least 100 MPa tensile.

6. The non-volatile memory cell of claim 1, further comprising:
 a gate dielectric; and
 a select gate on the gate dielectric;
   a second dielectric layer including a first portion located along a sidewall of the select gate, wherein the plurality of discrete storage elements is located on the second dielectric layer; and
   the gate extends along the sidewall and over a portion of the select gate, wherein the gate is characterized as a control gate.

7. The non-volatile memory cell of claim 1, wherein the tensile dielectric layer has a thickness of at least 80 percent of an average height of the plurality of discrete storage elements.

8. The non-volatile memory cell of claim 7, wherein the tensile dielectric layer is characterized as being at least 100 MPa tensile.

9. The non-volatile memory cell of claim 3, wherein the tensile dielectric layer is characterized as being at least 100 MPa tensile.

10. The non-volatile memory cell of claim 3, wherein the tensile dielectric layer has a thickness of at least 80 percent of an average height of the plurality of discrete storage elements.

* * * * *